(12) United States Patent
Marple (10) Patent No.: US 11,255,933 B2
(45) Date of Patent: Feb. 22, 2022

(54) OPERANDO NUCLEAR MAGNETIC RESONANCE ROTOR INSERT

(71) Applicant: LAWRENCE LIVERMORE NATIONAL SECURITY, LLC, Livermore, CA (US)

(72) Inventor: Maxwell Marple, Berkeley, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 17/122,233

(22) Filed: Dec. 15, 2020

(65) Prior Publication Data

US 2021/0215777 A1   Jul. 15, 2021

Related U.S. Application Data

(60) Provisional application No. 62/961,332, filed on Jan. 15, 2020.

(51) Int. Cl.
*G01R 33/30* (2006.01)
*G01R 33/46* (2006.01)

(52) U.S. Cl.
CPC .......... *G01R 33/307* (2013.01); *G01R 33/46* (2013.01)

(58) Field of Classification Search
CPC ....... G01R 33/307; G01R 33/46; G01N 24/08
See application file for complete search history.

(56) References Cited

U.S. PATENT DOCUMENTS

| | | | |
|---|---|---|---|
| 4,899,111 A | 2/1990 | Pines et al. | |
| 5,760,586 A | 6/1998 | Foerster et al. | |
| 7,358,734 B2 | 4/2008 | Blumich et al. | |
| 8,692,548 B2 | 4/2014 | Hoyt et al. | |
| 9,151,813 B2 | 10/2015 | Hu et al. | |
| 9,835,698 B2 | 12/2017 | Hoyt et al. | |
| 2014/0044598 A1 | 2/2014 | Hu et al. | |
| 2016/0116540 A1* | 4/2016 | Zheng | G01N 24/08 324/322 |

* cited by examiner

*Primary Examiner* — Jay Patidar
(74) *Attorney, Agent, or Firm* — Eddie E. Scott (57) ABSTRACT

A magic angle sample spinning nuclear magnetic resonance system including a housing, a cryogenic fluid in the housing, a magnet in the housing, a probe in the housing, a magic angle sample spinning insert in the probe, a sample battery in the magic angle sample spinning insert, a photovoltaic cell in the magic angle sample spinning insert wherein the photovoltaic cell is connected to the sample battery, an optic fiber operatively connected to the photovoltaic cell, and a laser operatively connected to the optic fiber wherein the laser provides power to charge the sample battery during the magic angle sample spinning nuclear magnetic resonance.

22 Claims, 6 Drawing Sheets

FIG. 4

OPERANDO NUCLEAR MAGNETIC RESONANCE ROTOR INSERT

CROSS-REFERENCE TO RELATED APPLICATIONS

This application claims priority to and benefit under 35 U.S.C. § 119(e) of U.S. Provisional Patent Application No. 62/961,332 filed Jan. 15, 2020 entitled "operando solid-state nuclear magnetic resonance spectroscopy for probing materials and devices under electrical bias and the specialized rotor insert required," the content of which is hereby incorporated by reference in its entirety for all purposes.

STATEMENT AS TO RIGHTS TO APPLICATIONS MADE UNDER FEDERALLY SPONSORED RESEARCH AND DEVELOPMENT

The United States Government has rights in this application pursuant to Contract No. DE-AC52-07NA27344 between the United States Department of Energy and Lawrence Livermore National Security, LLC for the operation of Lawrence Livermore National Laboratory.

BACKGROUND

Field of Endeavor

The present application relates to nuclear magnetic resonance spectroscopy and more particularly to operando solid-state nuclear magnetic resonance spectroscopy having a specialized rotor insert for probing materials and devices under electrical bias.

State of Technology

This section provides background information related to the present disclosure which is not necessarily prior art.

Operando spectroscopy as it relates to electrochemical cells, ie batteries, is a form of spectroscopic characterization of the electrochemical cells or its constituent components during operation such as charging or discharging a battery. One of the concerns of this methodology is to establish structure-property relationships of the cell's components and thereby yield information about mechanisms. The information provides an unparalleled perspective to understand the function of materials and their combinations within a battery promoting engineering improvements to existing electrochemical cells, processes and in developing new ones.

U.S. Published Patent Application No. 2014/0044598 for "High Temperature and High Pressure Magic Angle Spinning Nuclear Magnetic Resonance" published Feb. 13, 2014 provides the state of technology information reproduced below.

"[0004] High resolution magic angle spinning (MAS) nuclear magnetic resonance (NMR) spectroscopy is a powerful and versatile technique for studying molecular structure and dynamics in solid systems, semi-solid systems, or heterogeneous systems containing mixtures of e.g., solid, semi-solid, liquid, and gaseous phases. Thus MAS NMR is an attractive tool for in-situ investigations of reaction dynamics and intermediates, investigations of properties of active sites in catalysts during catalytic conversion of biogenic molecules in aqueous phase water, and physical/chemical properties and/or phase transitions in materials and material syntheses. However, reusable sample cells that perform well at temperatures greater than about 100. degree. C. and pressures greater than the vapor pressure of aqueous water have not been realized in MAS NMR to date due primarily to technical difficulties associated with sealing heterogeneous fluid samples at high temperature and high pressure conditions that would prevent leakage of fluids while spinning samples at a spinning rate of several kHz or more inside a strong magnetic field. To date, MAS NMR experiments have been performed at pressures of about 150 bar and temperatures up to 80° C. using a zirconia rotor sleeve and plastic components including bushings, O-rings, valves, and valve adaptors detailed, e.g., by Hu et al. in "High-Pressure Magic Angle Spinning Nuclear Magnetic Resonance", J. Magn. Reson., 212, 378-385 (2011); Hu et al. in "Rotor Design for High Pressure Magic Angle Spinning Nuclear Magnetic Resonance", J. Magn. Reson., 226, 64-69 (2012); and US Patent Publication No.: 2012/0146636. However, plastic components soften at higher temperatures, rendering previous designs unsuitable at temperatures above 100. degree. C. Accordingly, new rotor designs are needed that provide sealing of heterogeneous fluid samples at high temperature and high pressure conditions and prevent leakage of fluids while spinning samples at spinning rates of several kHz or more inside strong magnetic fields. The present invention addresses these needs."

SUMMARY

Features and advantages of the disclosed apparatus, systems, and methods will become apparent from the following description. Applicant is providing this description, which includes drawings and examples of specific embodiments, to give a broad representation of the apparatus, systems, and methods. Various changes and modifications within the spirit and scope of the application will become apparent to those skilled in the art from this description and by practice of the apparatus, systems, and methods. The scope of the apparatus, systems, and methods is not intended to be limited to the particular forms disclosed and the application covers all modifications, equivalents, and alternatives falling within the spirit and scope of the apparatus, systems, and methods as defined by the claims.

The inventor's disclose magic angle sample spinning (MAS) nuclear magnetic resonance (NMR) measurement apparatus, systems and methods, that include a housing, a cryogenic fluid in the housing, a magnet in the housing, a probe in the housing, a magic angle sample spinning insert in the probe, a sample battery in the magic angle sample spinning insert, a photovoltaic cell in the magic angle sample spinning insert wherein the photovoltaic cell is connected to the sample battery, an optic fiber operatively connected to the photovoltaic cell, and a laser operatively connected to the optic fiber; and wirelessly charging or discharging the sample battery during the magic angle sample spinning (MAS) nuclear magnetic resonance (NMR).

The inventors' apparatus, systems, and methods have use in wirelessly charging or discharging batteries during a magic angle spinning NMR measurement when conducting operando NMR experiments to thereby apply an electrical bias on the material or device under test, and in other operations.

The apparatus, systems, and methods are susceptible to modifications and alternative forms. Specific embodiments are shown by way of example. It is to be understood that the apparatus, systems, and methods are not limited to the particular forms disclosed. The apparatus, systems, and methods cover all modifications, equivalents, and alternatives falling within the spirit and scope of the application as defined by the claims.

BRIEF DESCRIPTION OF THE DRAWINGS

The accompanying drawings, which are incorporated into and constitute a part of the specification, illustrate specific embodiments of the apparatus, systems, and methods and, together with the general description given above, and the detailed description of the specific embodiments, serve to explain the principles of the apparatus, systems, and methods.

DETAILED DESCRIPTION OF SPECIFIC EMBODIMENTS

Referring to the drawings, to the following detailed description, and to incorporated materials, detailed information about the apparatus, systems, and methods is provided including the description of specific embodiments. The detailed description serves to explain the principles of the apparatus, systems, and methods. The apparatus, systems, and methods are susceptible to modifications and alternative forms. The application is not limited to the particular forms disclosed. The application covers all modifications, equivalents, and alternatives falling within the spirit and scope of the apparatus, systems, and methods as defined by the claims.

Definition: The term "Magic angle spinning (MAS)" as used in this application means NMR spectroscopy in which the sample is physically spun within a rotor at speeds >5 kHz. The term "Magic angle spinning (MAS)" is further defined in U.S. Published Patent Application No. 2014/0044598 for "High Temperature and High Pressure Magic Angle Spinning Nuclear Magnetic Resonance" published Feb. 13, 2014.

The transition to a carbon negative economy will require an increased demand for better performing batteries for grid storage and transportation. Solid-state batteries are an inherently safer and higher energy density alternative to current liquid electrolyte batteries; however, their performance is generally hindered by the formation of solid-solid interface (SSI) between the solid electrolyte and electrodes. The exact mechanism of how the SSI forms and influences battery performance is still unknown due to poor understanding of its composition, structure, and kinetics. This insight is exceptionally difficult to achieve with standard interrogation techniques as the SSI can be nanometers thick, highly disordered, and any information on reaction dynamics are hidden from detection because the interface is buried deep within the electrochemical cell. Only by understanding the atomic level mechanisms influencing charge transfer kinetics contributing to the formation of the SSI will it be possible to develop a complete picture of how its formation ultimately affects solid-state battery performance.

Probing the SSI during charging and discharging requires a non-destructive operando experimental technique sensitive to the small quantity of the SSI and can detect simultaneously structure and dynamics, all within a fully operational cell. Such an experimental technique does not exist. Solid-state NMR spectroscopy is uniquely suited to address these challenges as it is sensitive to local structure and dynamics. The NMR signal arises from the entirety of the sample, making buried interfaces observable. While the presence of local charge distributions, anisotropies, and couplings to neighboring nuclei have the potential to provide detailed structural information, they also severely broaden the resulting NMR signal in the solid state. Magic angle spinning (MAS), in which the sample is physically spun within a rotor at speeds >5 kHz can overcome these interactions and narrow the line shapes, so these effects are detectable and distinguishable. Implementing MAS for solid-state operando NMR carries technical challenges that this research aims to address. The ability to acquire advanced high-resolution NMR spectra of the weak signal generated from the SSI formed during operation is critical for developing a deeper understanding of the connection between interfacial structure and dynamics and will lead to a breakthrough in advancing solid-state battery technology.

Solid-state batteries are an inherently safer and higher energy density alternative to current liquid electrolyte batteries; however, their performance is generally hindered by the formation of solid-solid interface (SSI) between the solid electrolyte and electrodes. The exact mechanism of how the SSI forms and influences battery performance is still unknown due to poor understanding of its composition, structure, and kinetics. This insight is exceptionally difficult with standard interrogation techniques as the SSI is nanometers thick and highly disordered, and many solid electrolytes are susceptible to probe damage. Any information on reaction dynamics are hidden from detection because the interface is buried deep within the electrochemical cell. Recent studies have tried to address this by focusing on in situ growth and electrochemistry, revealing the chemical changes induced as a function of state of charge. These techniques have provided insight into the chemical and structural evolution of interfaces, though lack insight into the complex kinetics occurring during formation of the SSI. Only by understanding the atomic level mechanisms influencing charge transfer kinetics contributing to the formation of the SSI will it be possible to develop a complete picture of how its formation ultimately affects solid state battery performance.

Probing the SSI structure at the atomic level requires a non-destructive operando experimental technique sensitive to small quantities and can simultaneously detect structure and dynamics, all within a fully operational cell. Such an experimental technique does not exist. Solid-state NMR spectroscopy is sensitive to local structure and dynamics and is uniquely suited to address these challenges. Through exciting and manipulating the nuclear spin system the measured NMR signal has the advantages of being element selective, quantitative, and originates from the sample volume, making buried interfaces observable. The presence of local charge distributions, anisotropies, and couplings to neighboring nuclei have the potential to provide detailed structural information but also severely broaden the resulting NMR signal in the solid state. Magic angle spinning (MAS), in which the sample is physically spun within a rotor at speeds >5 kHz, can overcome these interactions and narrow the line shapes so they are detectable and distinguishable. Implementing MAS for solid-state in situ NMR carries many technical challenges that this research aims to address. The ability to acquire advanced high-resolution NMR spectra of the weak signal generated from the SSI formed during operation is critical for developing a deeper understanding of the connection between interfacial structure and dynamics.

There are ongoing efforts to utilize solid-state NMR to investigate battery materials by other national labs and universities, though they currently lack the resolution and sensitivity for probing the SSI. The state of the art uses either ex-situ techniques with enriched Li metal to track transport or is predominantly focused on liquid electrolyte batteries under static conditions that lack resolution for the proposed work. The inventor's operando MAS apparatus, systems, and methods promise to observe mobile and immobile battery components with high resolution before and after charge cycling.

The development of operando NMR capabilities provide direct access to the complex kinetics occurring at the SSI while under bias and elucidate the atomic and structural mechanisms that ultimately determine macroscopic battery performance. However, there are many technical challenges that need to be resolved before the technique can be widely applied to solid-state battery research. The two biggest challenges with operando MAS NMR for battery research stems from the requirement of spinning the battery and charging it wirelessly. The problem of spinning the battery within the NMR magnet arises from the electronically conductive components of the current collectors and anode material. These components will generate eddy currents that will produce a torque to counteract the spinning as well as shield the radiofrequency used to generate and acquire the NMR signal. The second major technical challenge comes with charging/discharging the battery wirelessly while spinning without interfering with the NMR experiment. The inventor aims to address both these challenges with a spinning NMR rotor capable of wirelessly charging cylindrical microbatteries using a laser/photovoltaic pair.

The battery considered for one embodiment of the inventor's apparatus, systems, and methods is the thin film cell $LiCoO_2$/LiPON/a-Si. It will function as a model system since its performance has been well characterized and is capable of cycling at high cell potentials without electrolyte degradation or Li dendrite formation. This electrochemical cell is grown by RF sputtering ensuring materials reproducibility and exhibiting dense, uniform interfacial contact between the constituent materials.

Figure 1:
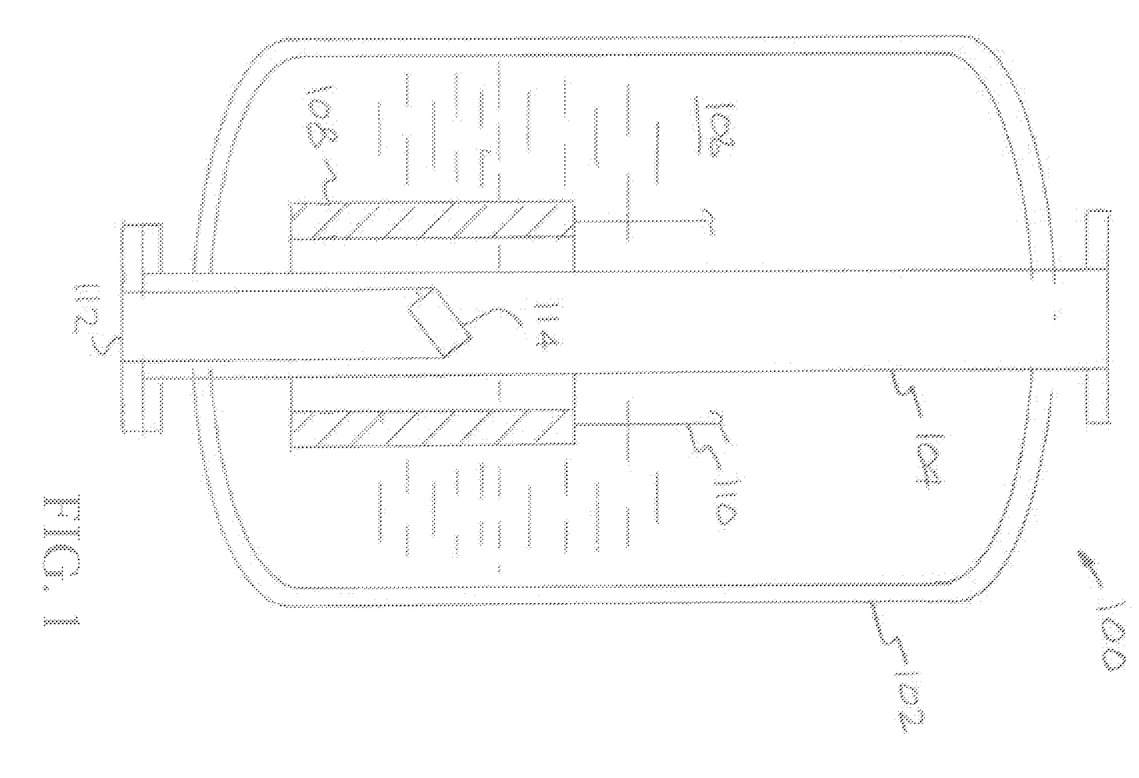
FIG. 1 is an illustrative perspective view of one embodiment of the inventor's operando solid-state nuclear magnetic resonance spectroscopy apparatus.

Referring to FIG. 1, an illustrative view shows an example embodiment of the inventor's apparatus, systems, and methods. The example embodiment is identified generally by the reference numeral 100. The inventor's apparatus and methods provide an operando solid-state nuclear magnetic resonance spectroscopy system having a specialized rotor insert for probing materials and devices under electrical bias.

FIG. 1 is an illustrative view Applicant's operando solid-state nuclear magnetic resonance spectroscopy system having a specialized rotor insert for probing materials and devices under electrical bias. The components of the inventor's apparatus, systems, and methods illustrated in FIG. 1 are listed below.

Housing (Reference Numeral 102),
Thru passage tube (Reference Numeral—104),
Cryogenic fluid (Reference Numeral—106),
Magnet (Reference Numeral—108),
Magnet leads (Reference Numeral—110),
Probe (Reference Numeral—112), and
Spinner Unit (Reference Numeral—114).

The description of the structural components of the example embodiment of the inventor's operando solid-state nuclear magnetic resonance spectroscopy system having a specialized rotor insert for probing materials and devices under electrical bias 100 having been completed, the operation and additional description of the inventor's apparatus, systems, and methods will now be considered in greater detail.

The basic components of a nuclear magnetic resonance spectroscopy system are a computer, a spectrometer and a super-conducting magnet. The computer is the instrument that controls the system and provided data processing. The spectrometer transmits and receives the radio-frequency waves used to make the NMR measurements. The super-conducting magnet generates a powerful magnetic field that is tens of thousands of times stronger that the earth's magnetic file. Samples are placed with the magnetic field and exposed to radio waves.

As illustrated in FIG. 1, the system 100 includes housing 102 containing cryogenic fluid 106. A thru passage tube 104 is located in housing 102. The probe 112 is positioned in the thru passage tube 104. The probe contains spinner unit 114. The magnet 108 is positioned around the probe 112 and the spinner unit 114.

There are three key aspects of the inventor's apparatus, systems, and methods 100:
cylindrical geometries of solid-state batteries,
a rotor insert that holds the battery while providing electrical leads for charging/discharging and a hermetic seal, and
power beaming through a coupled laser and vertical multi-junction photovoltaic cell mounted on the rotor insert.

The inventor's apparatus, systems, and methods 100 provide an operando solid-state nuclear magnetic resonance spectroscopy system having a specialized rotor insert for probing materials and devices under electrical bias. The system illustrated in FIG. 1 provides a solid-state NMR that enables observance of the chemical species and reaction kinetics during all points of a battery's operation.

The cylindrical battery promotes stable spinning and minimize the amount of metallic components within the battery cell. The cylindrical battery is attached to the rotor insert and then placed within a NMR rotor to protect the battery for the duration of the NMR experiment. The head of the rotor insert is accessible and has electrical contacts to place either a photovoltaic cell or a photoresistor for either charging or discharging, respectively. The operando functionality is enabled by optical wireless power transmission that will send power from a high energy coherent light source to the photovoltaic cell which will charge the battery and not interfere with the magnetic fields or radiofrequency used to measure the NMR signal. The operando NMR measurement allows for continuous monitoring of the battery components and of potential metastable states that may exist during charge cycling.

The inventors' apparatus, systems, and methods have use in wirelessly charging or discharging batteries during a magic angle spinning NMR measurement when conducting operando NMR experiments to thereby apply an electrical bias on the material or device under test, and in other operations.

Figure 2A:
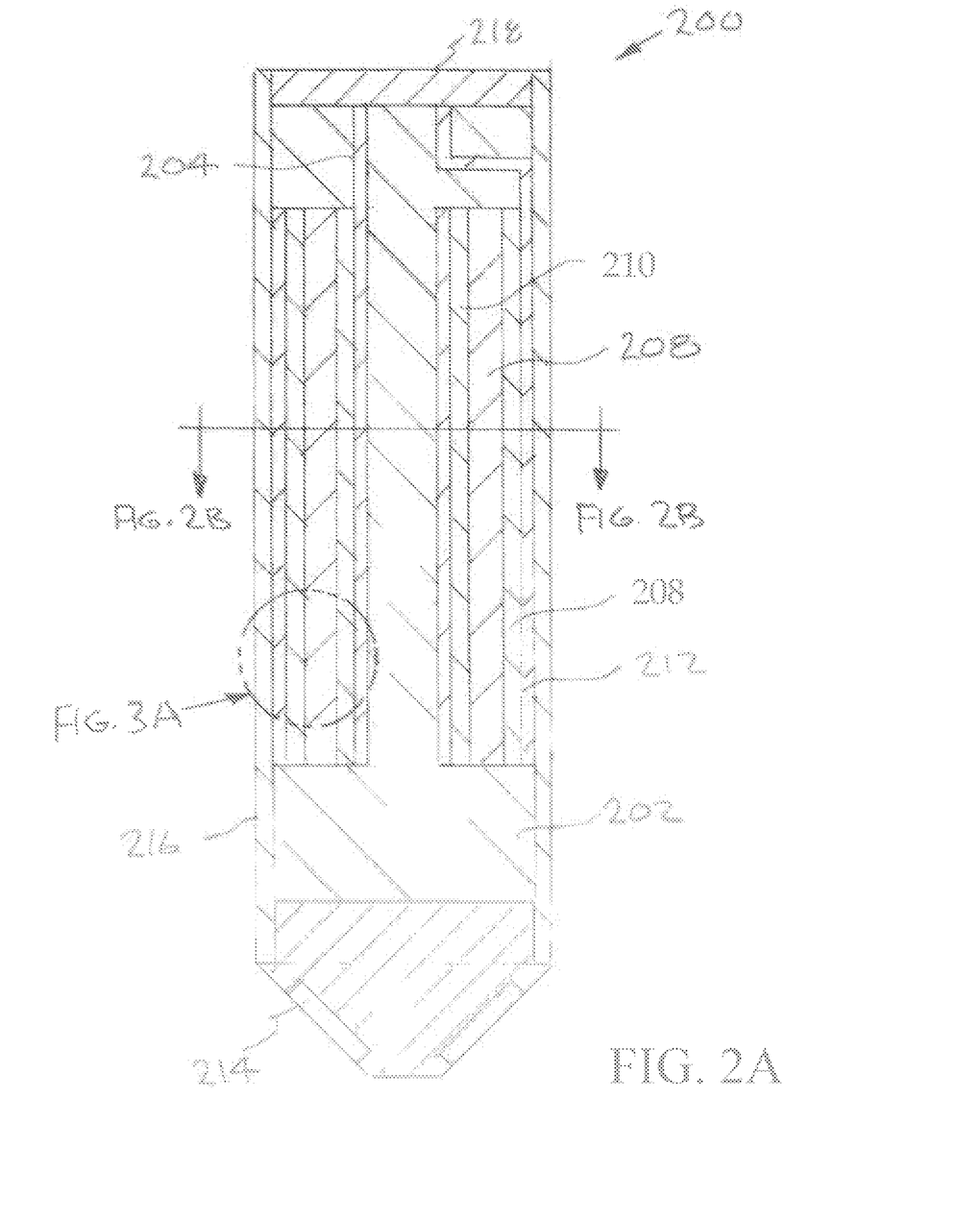
FIG. 2A is an illustrative perspective view of a cylindrical battery rotor insert.
Figure 2B:
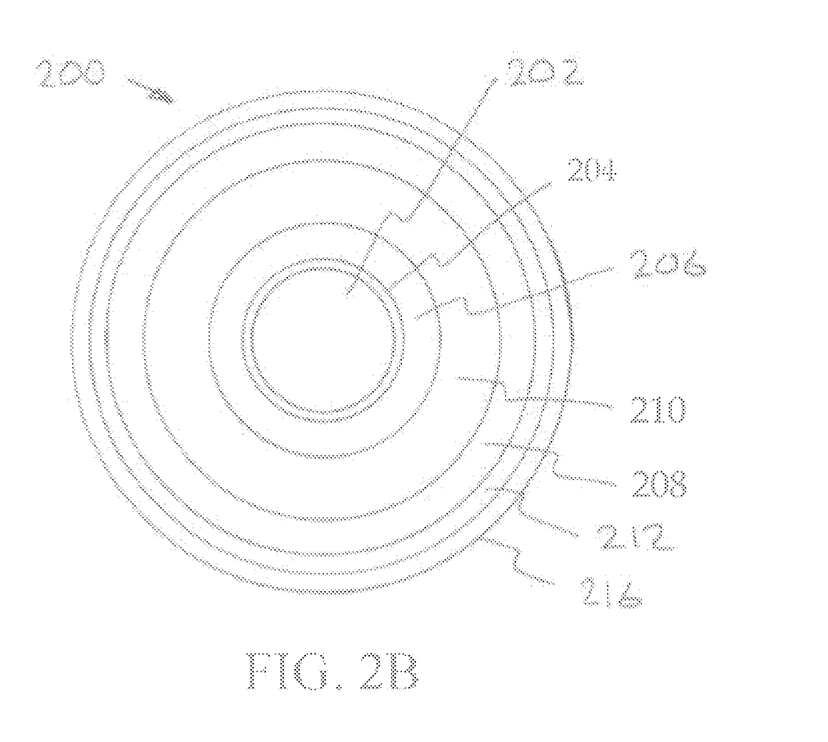
FIG. 2B is a cut away view the cylindrical battery rotor insert shown in FIG. 2A.

Referring to FIGS. 2A and 2B, an illustrative view shows a cylindrical battery rotor insert. The cylindrical battery rotor insert is identified generally by the reference numeral 200. The components of the cylindrical battery rotor insert 200 are listed below.

Core (Reference Numeral 202),
Current collector (Reference Numeral—204),
Anode (Reference Numeral—206),
Solid electrolyte (Reference Numeral—208),
Cathode (Reference Numeral—210),
Current collector (Reference Numeral—212),
Impeller (Reference Numeral—214),
Outer casing (Reference Numeral—216), and
photovoltaic cell—PV cell (Reference Numeral—218).

The description of the structural components of the cylindrical battery rotor insert 200 having been completed, the operation and additional description of the cylindrical battery rotor insert 200 will now be considered in greater detail. The inventor's apparatus, systems, and methods 200 provide an operando solid-state nuclear magnetic resonance spectroscopy system having a specialized rotor insert for probing materials and devices under electrical bias.

FIG. 2B, is a cut away view the cylindrical battery rotor insert shown in FIG. 2A take along the line and arrows designated 2B. The cylindrical battery rotor insert is identified generally by the reference numeral 200. The components of the cylindrical battery rotor insert 200 are listed below.

Core (Reference Numeral 202),
Current collector (Reference Numeral—204),
Anode (Reference Numeral—206),
Solid electrolyte (Reference Numeral—208),
Cathode (Reference Numeral—210),
Current collector (Reference Numeral—212),
Impeller (Reference Numeral—214), and
Outer casing (Reference Numeral—216).

The inventor's apparatus, systems, and methods 200 provide an operando solid-state nuclear magnetic resonance spectroscopy system having a specialized rotor insert for probing materials and devices under electrical bias.

Figure 3A:
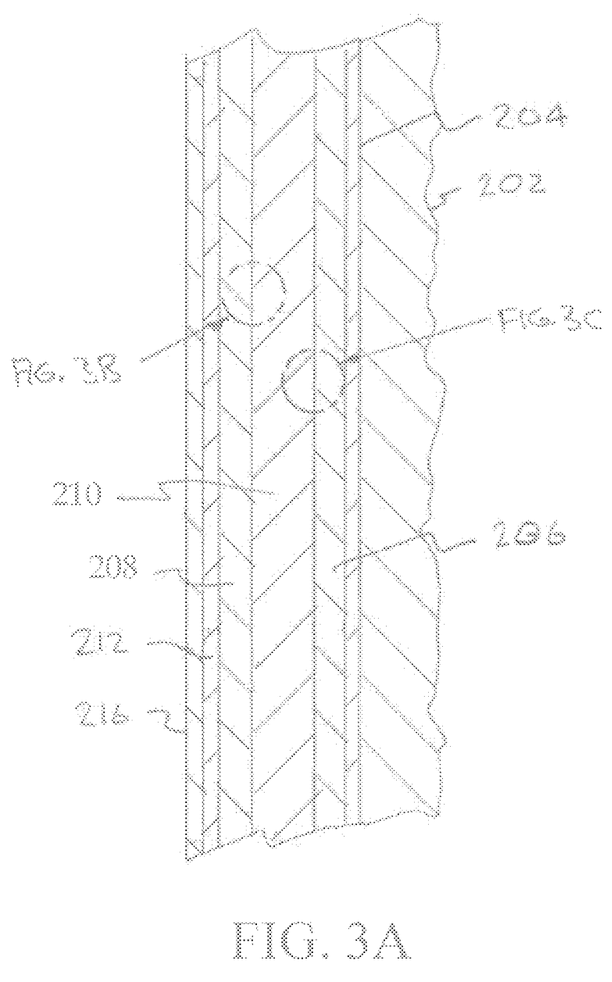
FIG. 3A a cut away view of the portion the cylindrical battery rotor insert shown in the circle labeled 3A in FIG. 2A.
Figure 3B:
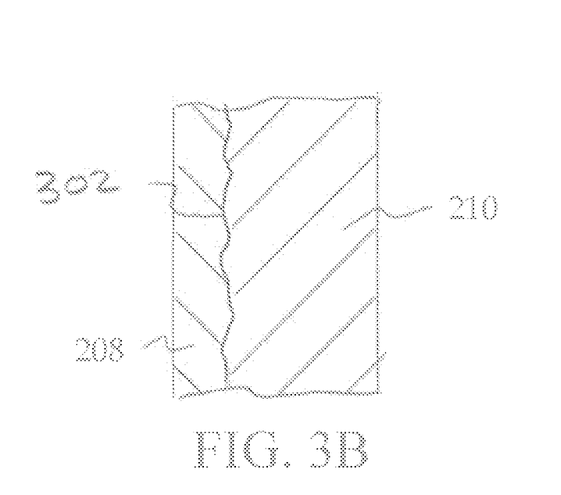
FIGS. 3B and 3C are cut away views of the portions the cylindrical battery rotor insert shown in the circles labeled 3B and 3C in FIG. 3A.

FIG. 3B shows the solid-electrolyte cathode interface that is illustrated by the circle portion of the cylindrical battery rotor insert labeled 3B illustrated in FIG. 3A. FIG. 3B shows cathode 210 and solid electrolyte 208 with the solid-electrolyte cathode interface 302 between cathode 210 and solid electrolyte 208. The inventors' apparatus, systems, and methods provide measurement and analysis of the solid-electrolyte cathode interface 302.

Figure 3C:
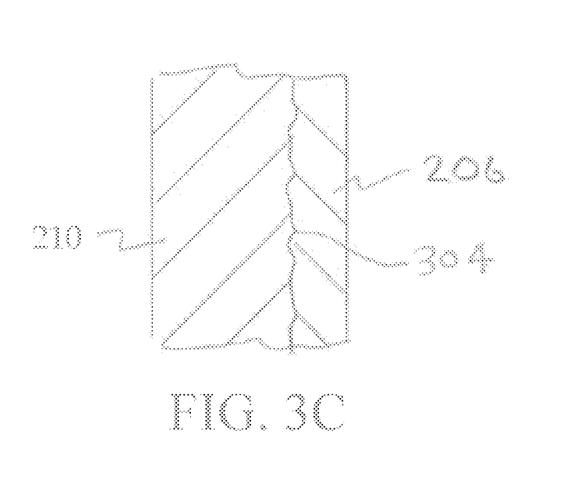

FIG. 3C shows the solid-electrolyte Anode interface that is illustrated by the circle portion of the cylindrical battery rotor insert labeled 3C illustrated in FIG. 3A. FIG. 3C shows Anode 206 and solid electrolyte 208 with the solid-electrolyte anode interface 304 between anode 206 and solid electrolyte 208. The inventors' apparatus, systems, and methods provide measurement and analysis of the solid-electrolyte anode interface 304.

Figure 4:
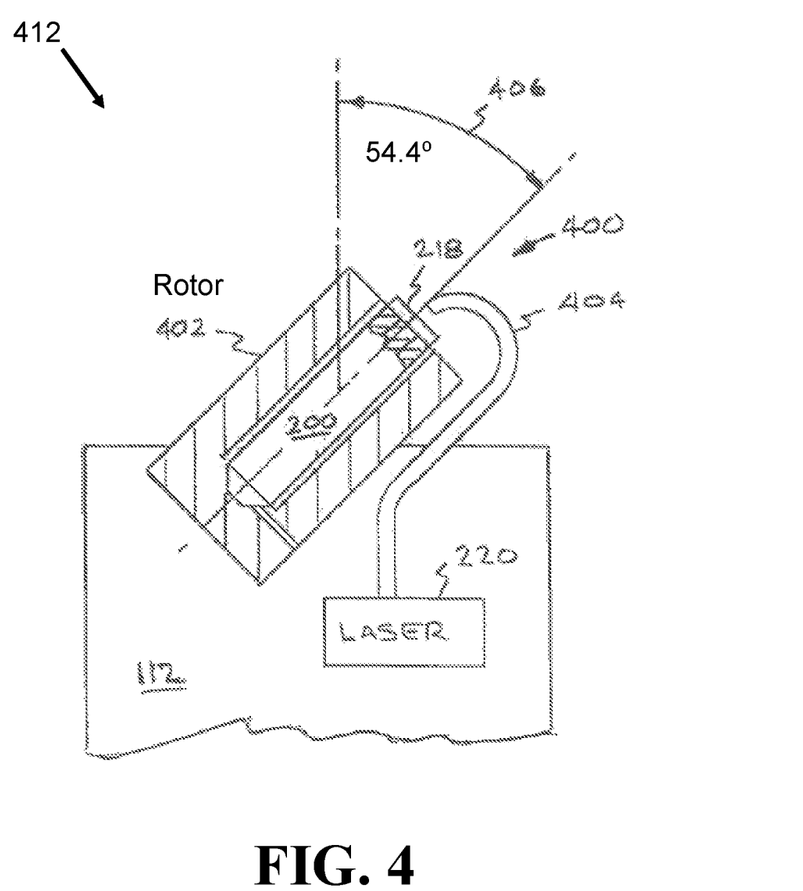
FIG. 4 is an illustrative perspective view of another embodiment of the inventor's operando solid-state nuclear magnetic resonance spectroscopy apparatus.

Referring to FIG. 4, an illustrative view shows another example embodiment of the inventor's apparatus, systems, and methods. This example embodiment is identified generally by the reference numeral 400. The inventor's apparatus and methods provide an operando solid-state nuclear magnetic resonance spectroscopy system having a specialized rotor insert for probing materials and devices under electrical bias.

FIG. 4 is an illustrative view Applicant's operando solid-state nuclear magnetic resonance spectroscopy system having a specialized rotor insert for probing materials and devices under electrical bias. The components of the inventor's apparatus, systems, and methods illustrated in FIG. 4 are listed below.

(Reference Numeral—412) Probe,
(Reference Numeral—200) Cylindrical battery rotor insert,
(Reference Numeral—402) Rotor,
(Reference Numeral—404) Optical fiber,
(Reference Numeral—218) Photovoltaic cell—PV cell, and
(Reference Numeral—406) angle of 54.4°
MAS=Magic Angle Spinning angle, The description of the structural components of the additional example embodiment of the inventor's operando solid-state nuclear magnetic resonance spectroscopy system having a specialized rotor insert for probing materials and devices under electrical bias 400 having been completed, the operation and additional description of the inventor's apparatus, systems, and methods will now be considered in greater detail.

The head of the rotor insert is accessible and has electrical contacts to place either a photovoltaic cell or a photoresistor for either charging or discharging, respectively. The operando functionality is enabled by optical wireless power transmission that will send power from a high energy coherent light source to the photovoltaic cell which will charge the battery and not interfere with the magnetic fields or radiofrequency used to measure the NMR signal. The operando NMR measurement allows for continuous monitoring of the battery components and of potential metastable states that may exist during charge cycling.

The inventors' apparatus, systems, and methods have use in wirelessly charging or discharging batteries during a magic angle spinning NMR measurement, in conduct operando NMR experiments to apply an electrical bias on the material or device under test, and in other operations.

Operando solid-state NMR for solid-state batteries will fill a critical experimental void by providing direct access to the complex kinetics occurring at the solid-solid interface under bias and allows for monitoring the extent of chemical reactions and their species within the battery during operation. While in principle solid-state NMR can observe the chemical species and reaction kinetics during all points of a battery's operation, there are prominent technical challenges arising from spinning the sample on the order of kilohertz required by magic angle spinning in order to obtain spectral resolution. These challenges are addressed and enable operando solid-state NMR by three key aspects: cylindrical geometries of solid-state batteries, a rotor insert that holds the battery while providing electrical leads for charging/discharging and a hermetic seal, and power beaming through a coupled laser and vertical multi-junction photovoltaic cell mounted on the rotor insert.

The cylindrical battery promotes stable spinning and minimize the amount of metallic components within the battery cell. The cylindrical battery is attached to the rotor insert and then placed within a NMR rotor to protect the battery for the duration of the NMR experiment. The head of the rotor insert is accessible and has electrical contacts to place either a photovoltaic cell or a photoresistor for either charging or discharging, respectively. The operando functionality is enabled by optical wireless power transmission that will send power from a high energy coherent light source to the photovoltaic cell which will charge the battery and not interfere with the magnetic fields or radiofrequency used to measure the NMR signal. The operando NMR measurement allows for continuous monitoring of the battery components and of potential metastable states that may exist during charge cycling.

The inventor has disclosed magic angle sample spinning (MAS) nuclear magnetic resonance (NMR) measurement apparatus, systems and methods. They include a magic angle sample spinning nuclear magnetic resonance system having a housing, a cryogenic fluid in the housing, a magnet in the housing, a probe in the housing, a magic angle sample spinning insert in the probe, a sample battery in the magic angle sample spinning insert, a photovoltaic cell in the magic angle sample spinning insert wherein the photovoltaic cell is connected to the sample battery, an optic fiber operatively connected to the photovoltaic cell, and a laser operatively connected to the optic fiber wherein the laser provides power to charge the sample battery during the magic angle sample spinning nuclear magnetic resonance.

Although the description above contains many details and specifics, these should not be construed as limiting the scope of the application but as merely providing illustrations of some of the presently preferred embodiments of the apparatus, systems, and methods. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present application fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present apparatus, systems, and methods, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

While the apparatus, systems, and methods may be susceptible to various modifications and alternative forms, specific embodiments have been shown by way of example in the drawings and have been described in detail herein. However, it should be understood that the application is not intended to be limited to the particular forms disclosed. Rather, the application is to cover all modifications, equivalents, and alternatives falling within the spirit and scope of the application as defined by the following appended claims.

The invention claimed is:

1. A nuclear magnetic resonance apparatus, comprising:
a housing,
a cryogenic fluid in said housing,
a magnet in said housing,
a probe in said housing,
a spinning insert in said probe,
a sample battery in said spinning insert,
a photovoltaic cell in said spinning insert wherein said photovoltaic cell is connected to said sample battery,
an optic fiber operatively connected to said photovoltaic cell, and
a laser operatively connected to said optic fiber wherein said laser provides power to charge said sample battery during nuclear magnetic resonance.

2. The nuclear magnetic resonance apparatus of claim 1 wherein said probe has a central axis and wherein said spinning insert in said probe is at an angle to said probe central axis.

3. The nuclear magnetic resonance apparatus of claim 1 wherein said probe has a central axis and wherein said spinning insert in said probe is at a fifty-four and four tenths degree angle to said probe central axis.

4. The nuclear magnetic resonance apparatus of claim 1 wherein said spinning insert in said probe is a magic angle spinning insert.

5. The nuclear magnetic resonance apparatus of claim 1 wherein said spinning insert in said probe is an operando nuclear magnetic resonance spectroscopy magic angle spinning insert.

6. The nuclear magnetic resonance apparatus of claim 1 wherein said spinning insert in said probe is an operando solid-state nuclear magnetic resonance spectroscopy magic angle spinning insert.

7. The nuclear magnetic resonance apparatus of claim 1 wherein said spinning insert in said probe includes an impeller.

8. The nuclear magnetic resonance apparatus of claim 1 wherein said spinning insert in said probe includes a nuclear magnetic resonance rotor.

9. A nuclear magnetic resonance apparatus, comprising:
a housing,
a cryogenic fluid in said housing,
a magnet in said housing,
a probe in said housing,
a spinning insert in said probe,
a sample battery in said spinning insert,
a photovoltaic cell in said spinning insert wherein said photovoltaic cell is connected to said sample battery,
an optic fiber operatively connected to said photovoltaic cell, and a laser operatively connected to said optic fiber wherein said laser provides power to charge said sample battery during spinning of said spinning insert.

10. The nuclear magnetic resonance apparatus of claim 9 wherein said probe has a central axis and wherein said spinning insert in said probe is at an angle to said probe central axis.

11. The nuclear magnetic resonance apparatus of claim 9 wherein said probe has a central axis and wherein said spinning insert in said probe is at a fifty-four and four tenths degree angle to said probe central axis.

12. The nuclear magnetic resonance apparatus of claim 9 wherein said spinning insert in said probe is a magic angle spinning insert.

13. The nuclear magnetic resonance apparatus of claim 9 wherein said spinning insert in said probe is an operando nuclear magnetic resonance spectroscopy magic angle spinning insert.

14. The nuclear magnetic resonance apparatus of claim 9 wherein said spinning insert in said probe is an operando solid-state nuclear magnetic resonance spectroscopy magic angle spinning insert.

15. The nuclear magnetic resonance apparatus of claim 9 wherein said spinning insert in said probe includes an impeller.

16. The nuclear magnetic resonance apparatus of claim 9 wherein said spinning insert in said probe includes a nuclear magnetic resonance rotor.

17. A nuclear magnetic resonance spectroscopy measurement method, comprising the steps of:
    providing a housing,
    providing a cryogenic fluid in said housing,
    providing a magnet in said housing,
    providing a probe in said housing,
    providing a spinning insert in said probe,
    providing a sample battery in said spinning insert,
    providing a photovoltaic cell in said spinning insert wherein said photovoltaic cell is connected to said sample battery,
    providing an optic fiber operatively connected to said photovoltaic cell,
    providing a laser operatively connected to said optic fiber wherein said laser provides power to charge said sample battery, and
    charging or discharging said sample battery during nuclear magnetic resonance spectroscopy.

18. The nuclear magnetic resonance spectroscopy measurement method of claim 17 wherein said probe has a central axis and wherein said step of providing a spinning insert in said probe comprises providing a spinning insert in said probe at an angle to said probe central axis.

19. The nuclear magnetic resonance spectroscopy measurement method of claim 17 wherein said probe has a central axis and wherein said step of providing a spinning insert in said probe comprises providing a spinning insert in said probe at a fifty-four and four tenths degree angle to said probe central axis.

20. The nuclear magnetic resonance spectroscopy measurement method of claim 17 wherein said step of providing a spinning insert in said probe comprises providing a magic angle spinning insert.

21. The nuclear magnetic resonance spectroscopy measurement method of claim 17 wherein said step of providing a spinning insert in said probe comprises providing an operando nuclear magnetic resonance spectroscopy magic angle spinning insert.

22. The nuclear magnetic resonance spectroscopy measurement method of claim 17 wherein said step of providing a spinning insert in said probe comprises providing an operando solid-state nuclear magnetic resonance spectroscopy magic angle spinning insert.

\* \* \* \* \*